(12) United States Patent
Wallace

(10) Patent No.: US 7,251,133 B2
(45) Date of Patent: Jul. 31, 2007

(54) DEVICE WITH AN EXTERNAL HEAT SINK ARRANGEMENT

(75) Inventor: Patrick Wallace, San Jose, CA (US)

(73) Assignee: Symbol Technologies, Inc., Holtsville, NY (US)

( * ) Notice: Subject to any disclaimer, the term of this patent is extended or adjusted under 35 U.S.C. 154(b) by 316 days.

(21) Appl. No.: 10/998,708

(22) Filed: Nov. 29, 2004

(65) Prior Publication Data

US 2006/0114655 A1    Jun. 1, 2006

(51) Int. Cl.
*H05K 7/20* (2006.01)
(52) U.S. Cl. ............... 361/690; 165/80.3; 165/185; 361/688; 361/715
(58) Field of Classification Search ............. 361/688, 361/690, 715
See application file for complete search history.

(56) References Cited

U.S. PATENT DOCUMENTS

| 5,525,835 A * | 6/1996 | Nishiguchi | 257/712 |
| 5,808,868 A * | 9/1998 | Drekmeier | 361/704 |
| 6,600,651 B1 * | 7/2003 | Weng | 361/700 |
| 6,999,317 B2 * | 2/2006 | Chengalva et al. | 361/715 |

* cited by examiner

*Primary Examiner*—Gregory D Thompson
(74) *Attorney, Agent, or Firm*—Fay Kaplun & Marcin, LLP.

(57) ABSTRACT

Described is a device which includes a housing, a chimney and a heat dissipation element. The housing includes at least one heat generating electric component mounted within an interior space thereof. The chimney extends from a proximal end surrounding a space adjacent to the at least one component through an opening in the housing to a distal end outside the housing. The heat dissipation element is attached to the distal end of the chimney and separated from the housing so that heat from the at least one component travels through the chimney to the heat dissipation element from which it is dissipated.

15 Claims, 5 Drawing Sheets

DEVICE WITH AN EXTERNAL HEAT SINK ARRANGEMENT

BACKGROUND INFORMATION

Thermal performance in a small electronics device is becoming increasingly challenging. Increasing CPU processing speeds, greater radio performance, and integrated power-over-ethernet ("POE") add significant thermal burdens to such a device.

In a conventional electronic device (e.g., one which has a relatively slow processor and a minimal radio performance), a cooling off process is generally managed by utilizing a venting system in a housing. Warm air simply escapes the warm device through the venting system, while cooler outside air enters the device to replace the exiting warmed air. Due to restrictions in air flow and limitations on installations and placements of such a device, this process remains useful for minimal heat loads and light performance applications.

As performance increased in an electronics device, a venting system is replaced or augmented by a metal enclosure. Some metal enclosures are designed to dissipate heat. For example, the metal enclosure may function as a heat sink and draw point heat off a device through conduction and spread the heat loads into an installed environment by both convective and radiative processes. However, such a device generally recycle a percentage of heat back in to the enclosure and radiative heating of the electronics by the metal inside is not prevented.

SUMMARY OF INVENTION

The present invention relates to a device which includes a housing, a chimney and a heat dissipation element. The housing includes at least one heat generating electric component mounted within an interior space thereof. The chimney extends from a proximal end surrounding a space adjacent to the at least one component through an opening in the housing to a distal end outside the housing. The heat dissipation element is attached to the distal end of the chimney and separated from the housing so that heat from the at least one component travels through the chimney to the heat dissipation element from which it is dissipated.

DETAILED DESCRIPTION

The present invention relates to a device which includes an external heat sink arrangement. For example, the present invention may be particularly useful for cooling small electronic devices.

Figure 1:
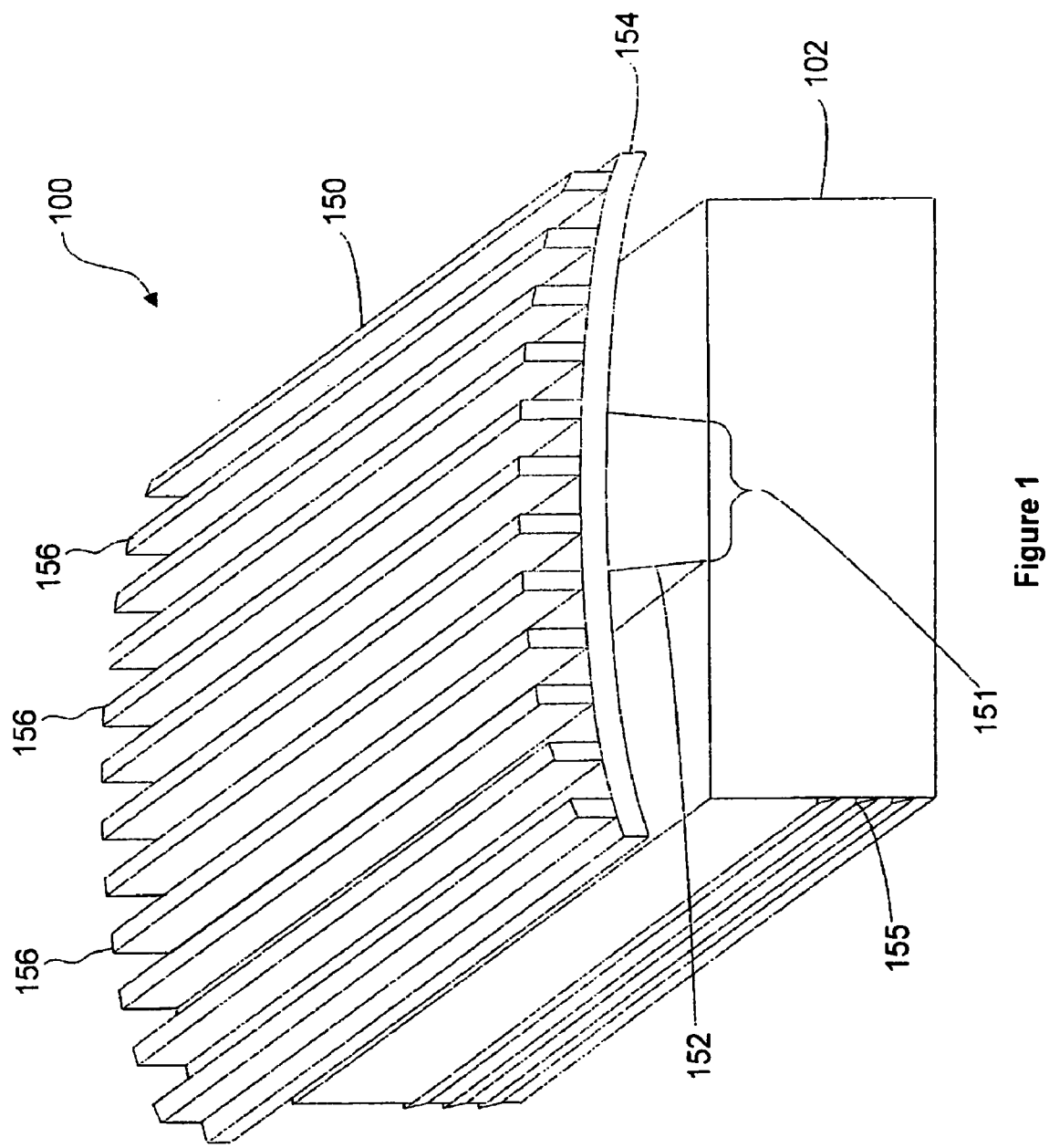
FIG. 1 shows an exemplary embodiment of a device according to the present invention.

FIG. 1 shows an exemplary embodiment of a device 100 according to the present invention. The device 100 may be, for example, a wireless portable, an access point, a router, etc.

The device 100 includes a housing 102. Certain electronic components of the device 100 may be stored within the housing 102. The housing 102 may be formed of a plastic material (e.g., injection molded or vacuum formed plastic). Housing 102 may also have a vent 155 on one or more sides. The housing 102 preferably has a high resistance to thermal conductivity. As one of ordinary skill in the art will therefore understand, the housing 102 may block radiative and convective recycled heat from reaching the electronic components.

The device 100 also includes at least one heat sink arrangement 150. The heat sink 150 includes at least one chimney 152. Those skilled in the art would understand that the chimney may have any desirable shape such a cylindrical shape, a rectangular shape, a square shape, etc. The chimney 152 may extend through an opening 151 in the housing 102. For example, the opening 151 may be a sized opening to accommodate exterior dimensions of the chimney 152. The chimney 152 is preferably manufactured using a thermally conductive material (e.g., a metal). The heat sink 150 includes a dissipation element 154 having at least one fin 156.

Figure 2:
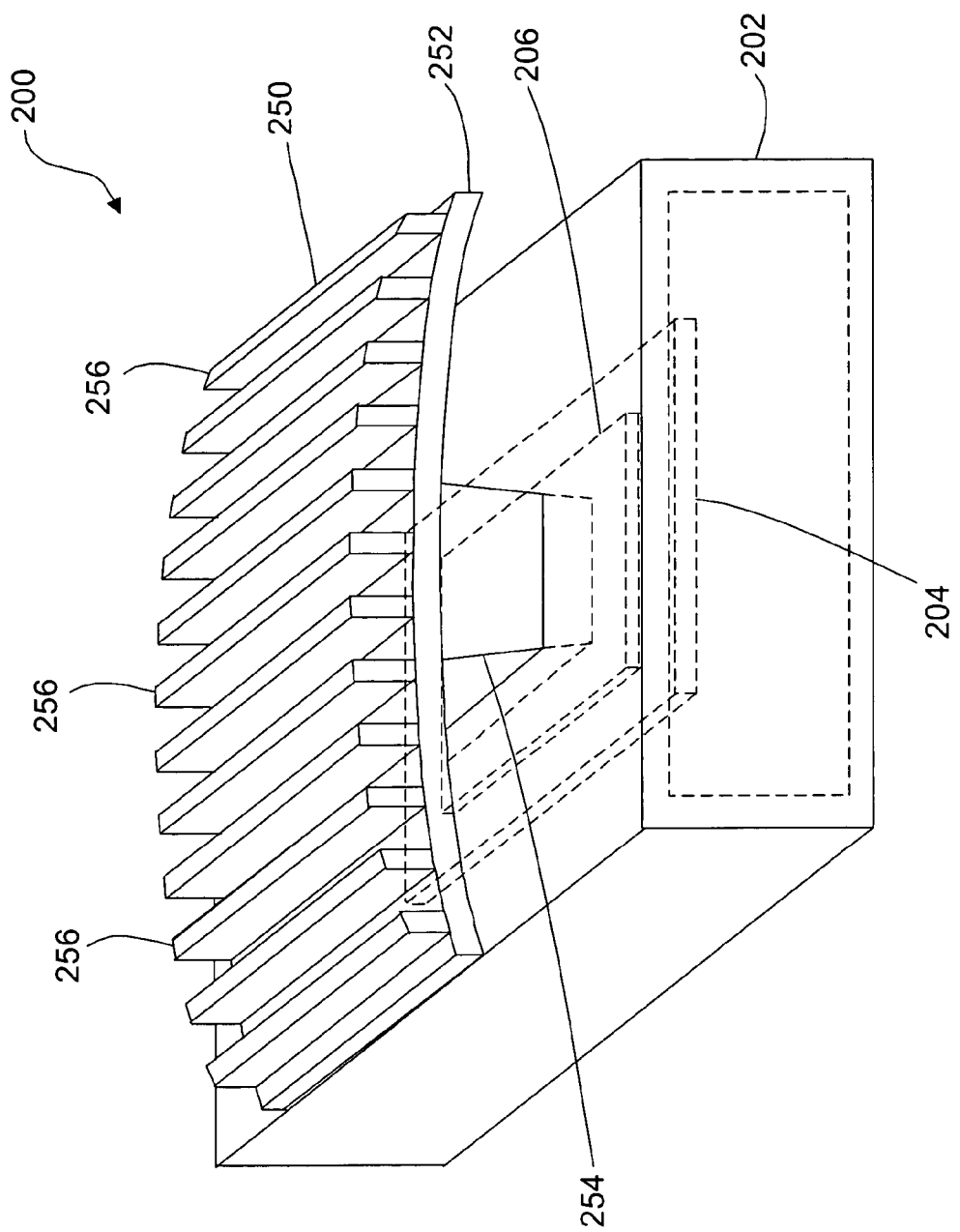
FIG. 2 shows another exemplary embodiment of the device according to the present invention.

FIG. 2 shows another exemplary embodiment of a device 200 according to the present invention. The device 200 may be an electronic device such as a wireless device. The device 200 includes a housing 202 and a circuit board 204 (e.g., a printed circuit board or "PCB") stored in the housing 202. The circuit board 204 may be of any shape, size, or design (e.g., form factor) known to those of skill in the art. The circuit board 204 may include any number and variety of circuit components (e.g., processors, memory, etc (not shown)). The circuit components may attach on either side of the circuit board 204 (e.g., top or bottom).

In the exemplary embodiment, the circuit board 204 includes a component 206. The component 206 may be, for example, a radio component, such as a PCI ("Peripheral Component Interconnect") radio card. For example, the component 206 may be a radio component for wireless networking (e.g., Wi-Fi compatible). As one of ordinary skill in the art will understand, the component 206 may generate heat while the device 200 is in use.

As described above, the device 200 includes at least one heat sink 250. The heat sink 250 includes a dissipation element 252 which has one or more fin 256 and a chimney 254. The chimney 254 of the heat sink 250 is preferably manufactured of a thermally conductive material (e.g., a metal). In the exemplary embodiment, the chimney 254 includes at least two sides being substantially normal the circuit board 204 (e.g., to reduce the viewing angle relevant to radiative heating). The chimney 254 may have a hollow or a solid construction. In the case of the hollow chimney, a highly thermally conductive material (e.g., an embedded copper metal) or some electrical contrivance 311 (e.g., to augment heat flow through the hollow chimney) may be incorporated within the hollow chimney.

The chimney 254 may be in close proximity or direct contact (e.g., at a proximal end) with the component 206.

The chimney 254 is preferably substantially perpendicular to the component 206. As one of ordinary skill in the art will understand, the heat sink 250 may draw point heat from the component 206 (e.g., a source load) via conduction through the chimney 254, into the dissipation element 252. The heat or heat load from the component 206 may be dissipated (e.g., via convection) into the environment from the fins 256.

Figure 3A:
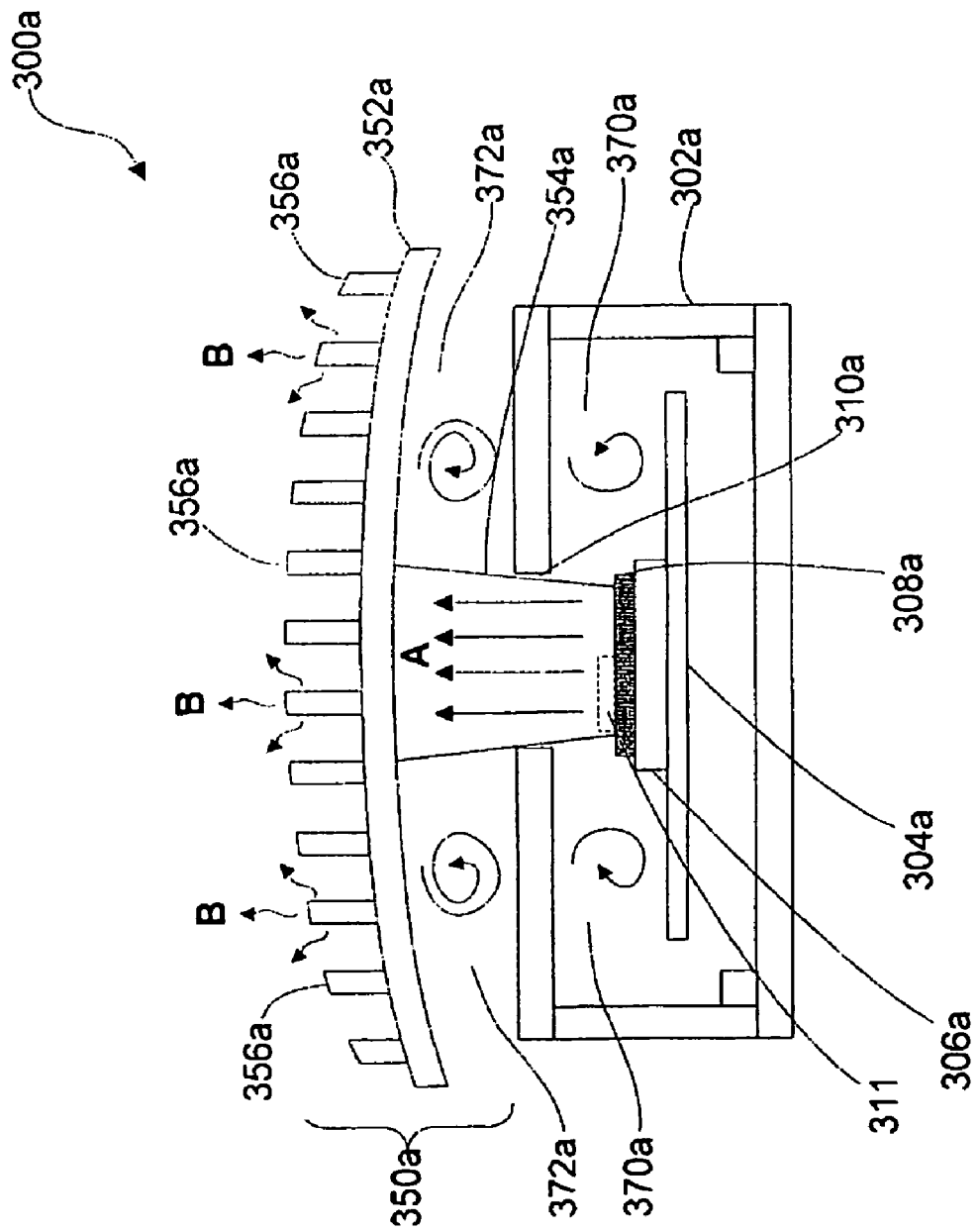
FIG. 3A shows a cross-sectional view of yet another exemplary embodiment of the device according to the present invention.

FIG. 3A shows a cross-sectional view of another exemplary embodiment of a device 300a according to the present invention. The device 300a includes a housing 302a (e.g., a plastic housing) enclosing, for example, a circuit board 304a. The circuit board 304a includes at least one component 306a.

The device 300a includes at least one heat sink 350a according to the present invention. The heat sink 350a includes a dissipation element 352a, at least one chimney 354a, and fins 356a. The chimney 354a is preferably substantially perpendicular to the component 306a. A proximal end of the chimney 354a may be in close proximity or direct contact with the component 306a. The chimney 354a passes through an opening 310a in the housing 302a to allow the heat sink 350a to draw point heat off the component 306a (e.g., in a direction A). The heat is transferred, via the chimney 354a, to the dissipation element 352a and/or the fins 356a and dissipated into the environment (e.g., in directions B).

The exemplary embodiment of the device 300a may also include a transfer layer 308a. The transfer layer 308a may have, for example, a Thermal Transfer Material ("TTM"). As one of ordinary skill in the art will understand, the transfer layer 308a may eliminate any air gap between the component 306a and the heat sink 350a. Heat from the component 306a may be conducted through the transfer layer 308a to the chimney 354a.

As shown in FIG. 3A, the dissipation element 352a is preferably not in contact with the housing 302a. The device 300a may include an external air insulator region 372a which is an open space located between the dissipation element 352a and a top portion of the housing 302a. The external air insulator region 372a is open on all sides to permit air flow. As one of ordinary skill in the art will understand, the external air insulator region 372a may be useful for ensuring that a substantial portion of heat is not recycled between the dissipation element 352a and the housing 302a. In addition, air flow through the external air insulator region 372a allows for convective venting of the recycled heat from concentrating on the housing 302a.

The device 300a according to the present invention may further include an internal air insulator region 370a. The internal air insulator region 370a includes space between the component 308a and inner portion of the housing 302a. The internal air insulator region 370a may prevent heat collected in the housing 302a from being passed to internal components (e.g., the circuit board 304a and components). The internal air insulator region 370a may also provide for protection from heat transferred between internal electronics and/or components (e.g., the components 306a) of the device 300a. In some exemplary embodiments, the housing 302a includes a vent on one or more sides. The vents may allow warm insulating air to escape and cooler insulating air to enter from the environment.

Figure 3B:
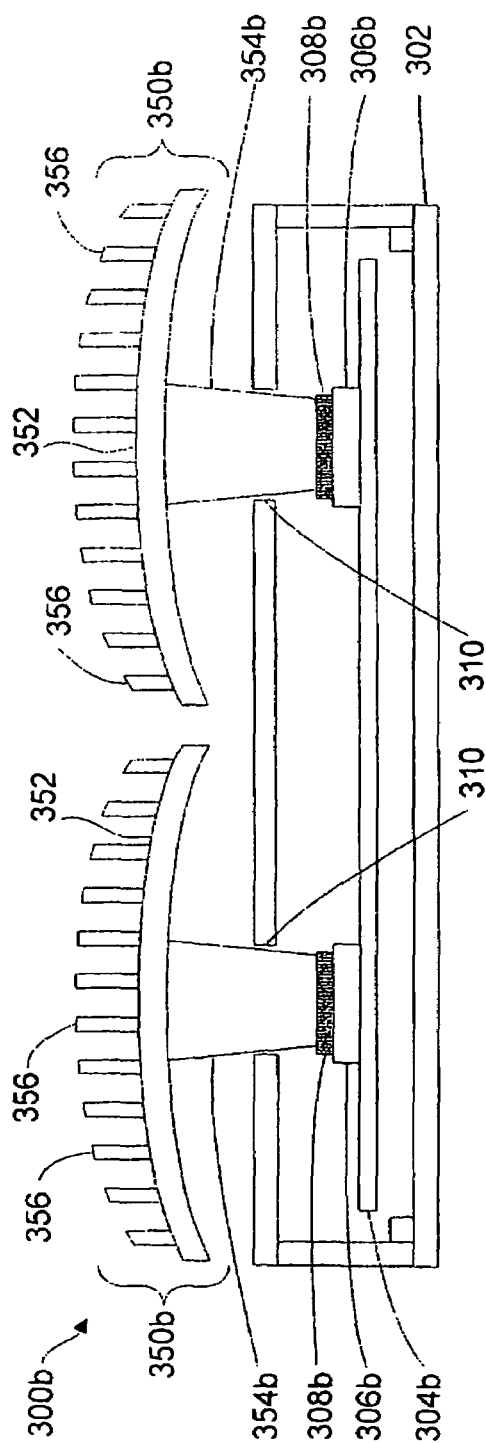
FIG. 3B shows a cross-sectional view of yet another exemplary embodiment of the device according to the present invention.
Figure 3C:
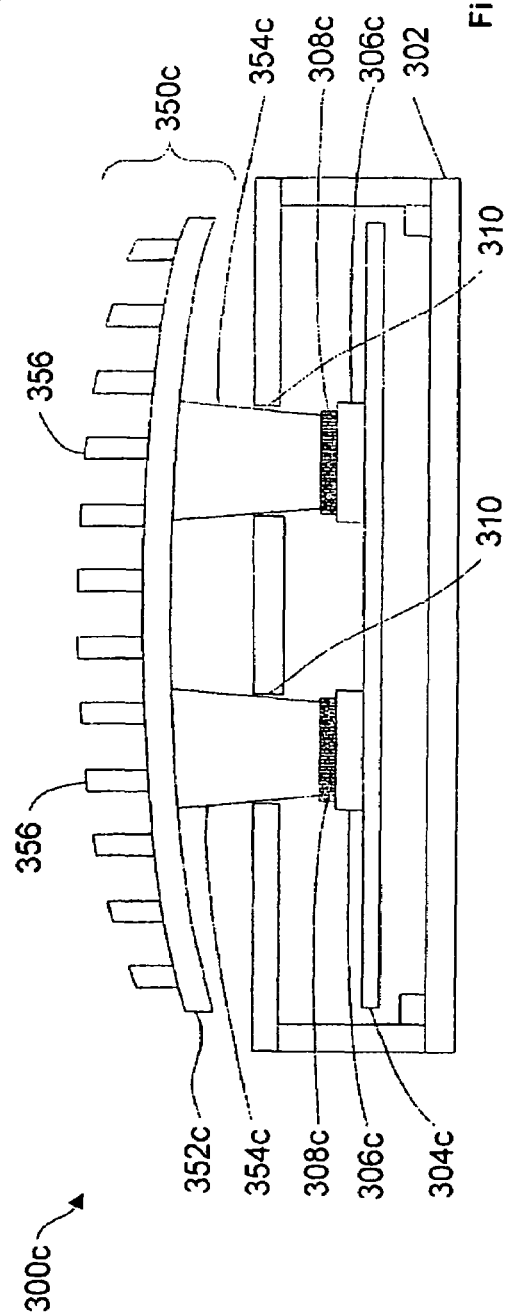
FIG. 3C shows a cross-sectional view of yet another exemplary embodiment of the device according to the present invention.

FIGS. 3B and 3C show further exemplary embodiments of the present invention. The device 300b shown in FIG. 3B is substantially similar to the device 300a. However, the device 300b includes an additional heat sink 350b to dissipate heat off another component 306b. As one of ordinary skill in the art will understand, devices 300b according to the present invention may include any number of components 306b. Each component 306b may have a corresponding heat sink 350b and chimney 354b.

Another exemplary embodiment of the device 300c is shown in FIG. 3C. The device 300c is substantially similar to the devices 300a. However, the device 300c includes an additional chimney 354c to dissipate heat off another component 306c. As discussed above, each component 306c of the device 300c may include a corresponding chimney 354c. In this exemplary embodiment, two or more chimneys 354c may transfer heat to the same dissipation element 352c.

Figure 4:
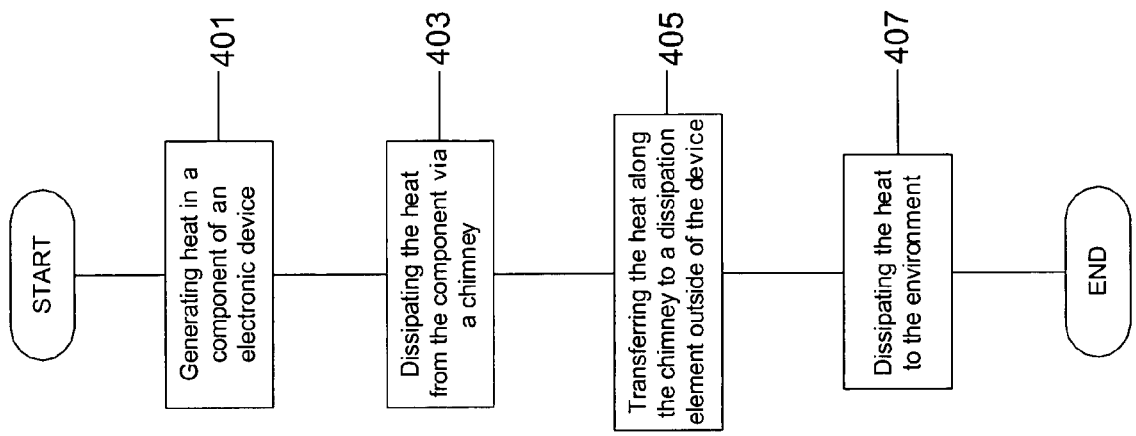
FIG. 4 shows a method for dissipating heat in the device according to the present invention.

FIG. 4 shows a method of dissipating heat in a device according to the present invention. In step 401, heat is generated by at least one component within a housing of the device. In step 403, the heat is dissipated from the component via a chimney which may be in direct or substantially close contact with the component. In step 405, the heat is transferred along the chimney to a dissipation element located outside of the housing of the device. In step 407, the heat is then dissipated to the environment from the dissipation element via convection and radiation.

The described embodiments of the present invention may provide for improved thermal performance in small electronic and wireless devices, while retaining the use of natural convection and radiative cooling. The improved thermal performance is accomplished via a highly efficient thermal path to move heat loads from a point of creation to the environment. The present invention is a light weight and low cost cooling solution using a minimal amount of metal material. The present invention also provides sufficient technology head room to permit substantial growth for at least five years.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A device comprising:
a housing including at least one heat generating electric component mounted within an interior space thereof;
a hollow chimney extending from a proximal end surrounding a space adjacent to the at least one component through an opening in the housing to a distal end outside the housing, the chimney including an arrangement augmenting heat flow through the chimney; and
a heat dissipation element attached to the distal end of the chimney and separated from the housing so that heat from the at least one component travels through the chimney to the heat dissipation element from which it is dissipated.

2. The device according to claim 1, wherein the at least one component is situated on a printed circuit board which is mounted within the housing.

3. The device according to claim 1, wherein the chimney made of a highly thermally conductive material.

4. The device according to claim 1, wherein the chimney is substantially perpendicular to a plain in which the at least one component is mounted.

5. The device according to claim 1, further comprising:
a further chimney surrounding space adjacent to a further heat generating electric component mounted within the interior space of the housing.

6. The device according to claim 1, wherein the chimney is formed of a first material, the at least one component of the device being formed of a second material, the first material being substantially thermally conductive relative to the second material.

7. The device according to claim 1, further comprising: a thermal transfer material contacting the at least one component and the proximal end of the chimney.

8. The device according to claim 6, wherein the housing is formed of a third material which is thermally insulative relative to the second material.

9. The device according to claim 2, wherein an interior space of the housing is opened between a surface of the printed circuit board and an interior wall of the housing.

10. The device according to claim 1, wherein the housing is manufactured of a plastic material.

11. The device according to claim 1, wherein the dissipation element includes at least one fin.

12. The device according to claim 1, wherein the chimney has one of a cylindrical shape, a rectangular shape and a square shape.

13. The device according to claim 1, comprising: a wireless transducer communicating wirelessly with a further device.

14. The device according to claim 1, wherein the dissipation element is spaced from the housing.

15. The device according to claim 1, further comprising: a venting arrangement for circulating air within the housing.

* * * * *